United States Patent [19]

Golladay et al.

[11] Patent Number: 4,943,769

[45] Date of Patent: Jul. 24, 1990

[54] APPARATUS AND METHOD FOR OPENS/SHORTS TESTING OF CAPACITIVELY COUPLED NETWORKS IN SUBSTRATES USING ELECTRON BEAMS

[75] Inventors: Steven D. Golladay, Hopewell Junction; Fritz J. Hohn, Somers; David J. Hutson, Apalachin; William D. Meisburger, San Jose; Juergen Rasch, Wappingers Falls, all of N.Y.

[73] Assignee: International Business Machines Corporation, Armonk, N.Y.

[21] Appl. No.: 326,772

[22] Filed: Mar. 21, 1989

[51] Int. Cl.$^5$ .................. G01R 31/28; H01J 37/26
[52] U.S. Cl. ........................ 324/158 R; 250/311; 324/158 D
[58] Field of Search .............. 324/158 R, 158 D; 250/310, 311

[56] References Cited

U.S. PATENT DOCUMENTS

| | | | |
|---|---|---|---|
| 3,694,652 | 9/1972 | Banbury et al. | 250/49.5 |
| 3,731,096 | 5/1973 | Carter | 250/49.5 |
| 4,169,244 | 9/1979 | Plows | 324/158 |
| 4,179,604 | 12/1979 | Christou | 250/305 |
| 4,292,519 | 9/1981 | Feuerbaum | 250/310 |
| 4,415,851 | 11/1983 | Langner | 324/51 |
| 4,417,203 | 11/1983 | Pfeiffer | 324/51 |
| 4,554,455 | 11/1985 | Todokoro et al. | 250/305 |
| 4,573,008 | 2/1986 | Lischke | 324/158 |
| 4,578,279 | 2/1984 | Zingher | 427/10 |
| 4,779,046 | 10/1988 | Rouberoi et al. | 324/158 R |
| 4,786,806 | 11/1988 | Listl | 250/310 |
| 4,829,243 | 5/1989 | Woodard, Sr. et al. | 324/158 R |

OTHER PUBLICATIONS

IBM Technical Disclosure Bullentin, vol. 25, No. 12, May 1983.
IBM Technical Disclosure Bulletin, vol. 28, No. 8, Jan. 1986.
Electron and Ion Beam Science and Tecnology Tenth Internation Conference, vol. 83-2.
Voltage Contrast Linearization with a Hemisphrical Retarding Analyser Journal of Physics E: Scientific Instruments 1974 vol. 7.
Scanning electron Microscopy/1982/II.

*Primary Examiner*—Ernest F. Karlsen
*Attorney, Agent, or Firm*—Graham S. Jones, II

[57] ABSTRACT

An E-beam testing system uses the E-beam to test a sample with conductive elements thereon. The system charges conductive elements on the sample. Above the sample and parallel to its upper surface is a stacked pair of parallel extraction grids. One grid is biased positively to accelerate secondary electrons emitted from the sample. The other grid is biased at a voltage to control the angular distribution of secondary electrons passing through the grid. Rectangular double grid sets, tilted with respect to the beam and the sample, are located above and laterally of the sample and the E-beam. Those grids are charged to attract secondary electrons from the sample. Triangular grids between the rectangular grids and a top grid above and parallel to the sample with an aperture therethrough for the E-beam are biased negatively to repel secondary electrons. Below the rectangular and triangular grids is located a cylindrical attraction grid biased positively, coaxial with the E-beam. A method of testing electrical connections and short circuits of conductors on a body of insulating material without physical contact includes the steps of: (a) applying an unfocused flood electron beam with a low current to a broad surface of the body, simultaneously applying a different focused probe electron beam having an energy predetermined to provide a charge of opposite polarity from the flood beam to other areas of the body to be probed, (b) generating an electron beam to cause secondary electron emission from the conductors; and (c) detecting the presence of connections not at a given potential.

5 Claims, 6 Drawing Sheets

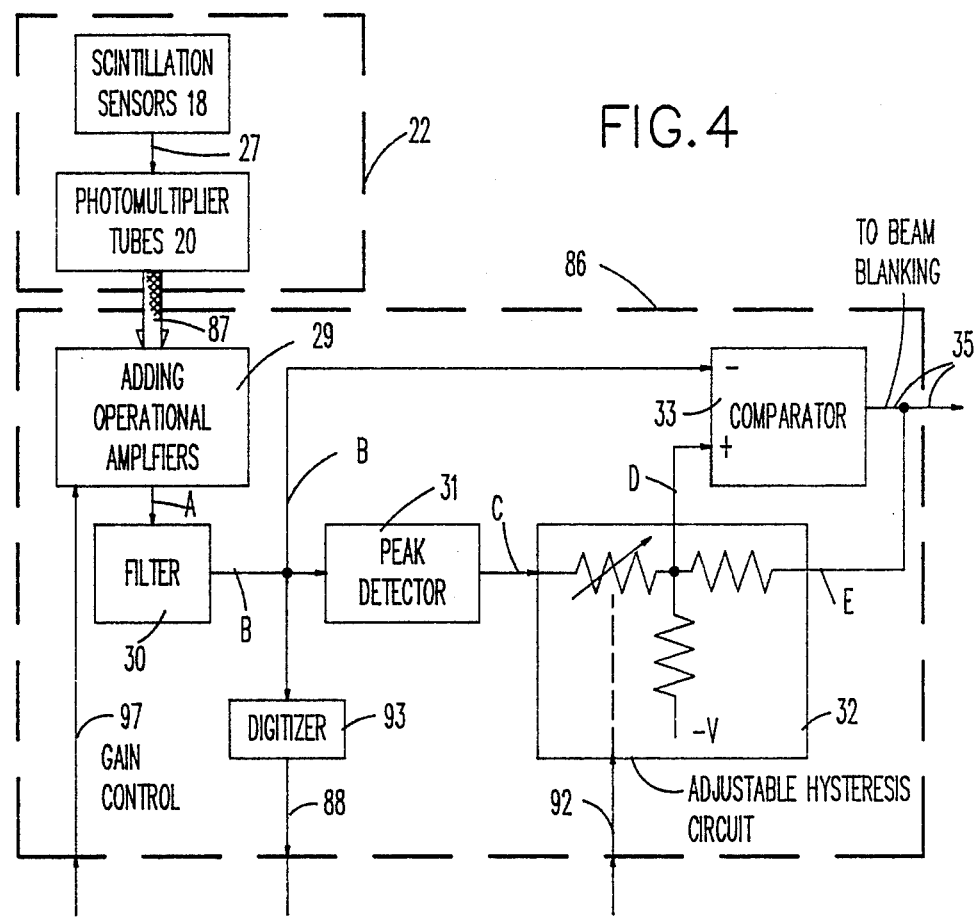
FIG. 4
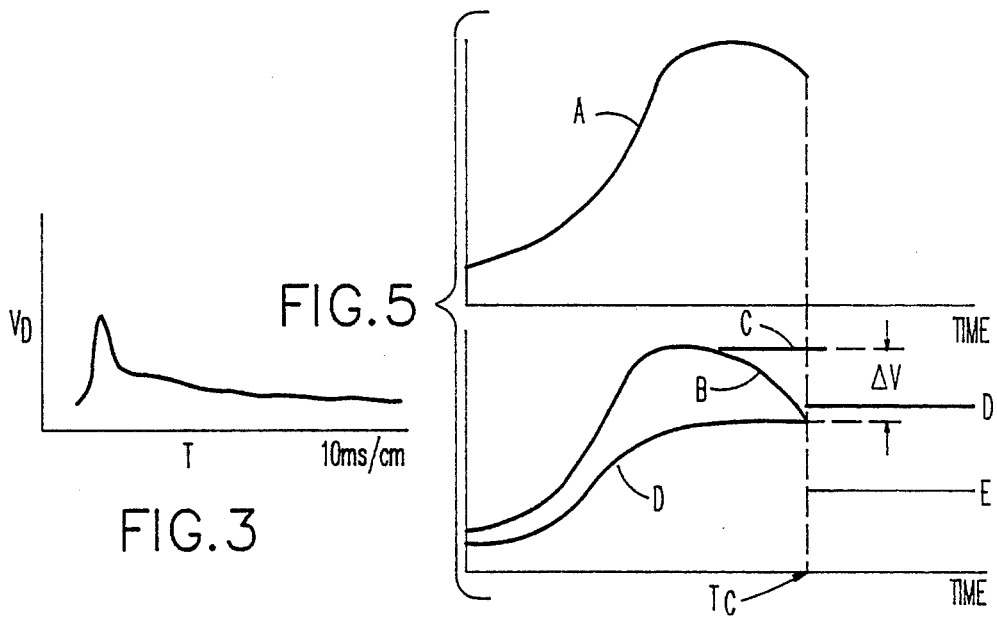
FIG. 3
FIG. 5

APPARATUS AND METHOD FOR OPENS/SHORTS TESTING OF CAPACITIVELY COUPLED NETWORKS IN SUBSTRATES USING ELECTRON BEAMS

BACKGROUND OF THE INVENTION

1. Field of the Invention

This invention relates to apparatus and methods for testing electrical connections between conductors on an insulating body by applying an electron beam to the surface of the device under test.

2. Related Art

U.S. Pat. Nos. 4,578,279; 4,417,203; and 4,415,851 (commonly assigned to the assignee of the instant application) all relate to use of E-beam testing of substrates.

U.S. Pat. No. 4,415,851 of Langner et al for "System for Contactless Testing of Multi-layer Ceramics" and U.S. Pat. No. 4,417,203 of Pfeiffer et al "System for Contactless Electrical Property Testing of Multi-layer Ceramics" disclose systems for testing of networks including both top to bottom and top to top connections. The systems include two E-beam flood guns and one scanning beam gun. The scanning beam is arranged to scan the top surface of the specimen under test. One flood gun irradiates the bottom surface for top to bottom testing. The other flood gun irradiates the top for testing top to top connections.

U.S. Pat. No. 4,578,279 of Zingher for "Inspection of Multilayer Ceramic Circuit Modules by Electrical Inspection of Unfired Green Sheets" describes employing electrical testing techniques including E-beam testing techniques.

W. H. Bruenger, F. J. Hohn, D. P. Kern, P. J. Coane, and T. H. P. Chang, "Electron Energy Analyzer for Applications in Large Scan Field for Electron Beam Testing", Proceedings of the Symposium on Electron and Ion Beam Science and Technology, Tenth International Conference 1982, The Electrochemical Society, Proceedings Vol. 83-2, pp. 159-169(1983) shows in FIG. 4 a four channel retarding field analyzer with successive extraction grid, "retard" grid and collector grid at a 45 degree angle to the vertical with respect to the target of the E-beam, with a sensor and photomultiplier tube behind the collector grid.

P. J. Fentem and A. Gopinath "Voltage Contrast Linearization with a Hemispherical Retarding Analyzer", Journal of Physics E: Scientific Instruments pp.930-933 (1974) Vol. 7, shows on page 931 a pair of hemispherical grids in both FIGS. 1a and 1b with grid B being a retarding grid. The article states, ". . . two hemispherical grids, which form the retarding analyzer, with the specimen at the centre." FIG. 1b shows a scintillator cage beyond the retarding grid B. With respect to the scintillator cage, the article states "Final collection was achieved . . . by placing a conventional scintillator cage detector close to the grids." It is stated in Fentem, et al with respect to FIG. 1a that grid A "is held at +60 V to ensure that secondary electrons emitted from the specimen are attracted outwards, although this results in the grid collecting some electrons. This grid should be at least, say, 15 V above the most positive potential applied to the retarding grid [B] because a rise in collected current at the solid hemisphere is observed when the potential of the retarding grid approaches that of the inner grid." From the point of view of this invention, Fentem, et al has drawbacks. Firstly, secondary electrons are caused to return to the sample. Secondly, there is no peak in the voltage contrast characteristic, the desirability of which is discussed later. Thirdly, the system is suitable only for relatively small samples.

S.D. Golladay, H.C. Pfeiffer, and M.A. Sturans, "Stabilizer Grid for Contrast Enhancement in Contactless Testing of MLC Modules", IBM Technical Disclosure Bulletin Vol 25, No. 12, May 1983, pp. 6621-6623) shows testing with E-beams using a negatively biased stabilizer grid between a flood gun and a sample.

U.S. patent application Ser. No. 925,764, filed Oct. 30, 1986, now U.S. Pat. No. 4,843,330 of Golladay, Hohn and Pfeiffer for "Electron Beam Contactless Testing System with Grid Bias Switching" describes an electron beam testing system wherein a grid is located above the device under test. The grid is employed both to assist charging and to extract secondary electrons from the device under test by switching the bias voltage applied to the grid.

Technical Problems

In accordance with the process employed by the method and apparatus of this invention, it is required that a relatively high energy beam should charge the circuit to be tested and then that a lower energy beam should be applied which will measure the voltage existing on each point on the network.

For the practical application of this test method novel apparatus and methods are required beyond that described in the related art. In particular, the following are required:

(1) a suitable voltage contrast detector,
(2) a method to control the charging process, and
(3) methods to test capacitively coupled networks.

For the purposes of electrical testing of substrates, a "suitable" voltage contrast detector must have the properties as follows:

1. Good contrast between charged and uncharged nets, i.e. good voltage contrast,
2. Physical compatibility with a large scan field,
3. Uniform contrast over a large substrate,
4. Non-return of low energy secondaries to the sample surface of the specimen under test. The return of such electrons can alter the electrical potential on pads or vias adjacent to the pads or vias which are being tested. This can produce a false indication of detection of defects in the specimen.

SUMMARY OF THE INVENTION

An object of this invention is to reduce testing costs compared to mechanical probe testers because of high tool throughput; to provide technology extendable to very small structures; to use a software driven addressing capability with its inherent flexibility, and the possibility of safe testing of materials which would be damaged by mechanical probing.

In accordance with this invention the potential of a circuit node is detected by measuring the quantity of secondary electrons of a predetermined range of energy levels emitted by each node in a network.

In accordance with this invention, an electron beam inspection system includes (a) means for directing an electron beam at a sample having a conductive element thereon,
(b) charging means for electrically charging the conductive element on the sample, (c) grid means for developing a positive charge for accelerating secondary electrons from the sample including
  (1) lateral grid means located laterally with respect to the beam and the sample, and
  (2) extractor grid means located above the sample,
(d) deflection means located above the sample comprising negatively charged elements for generating an electric field above the sample adjacent to the lateral grid means for deflecting secondary electrons generated on the sample laterally away from the beam and away from the sample and towards the lateral grid means.

One alternative arrangement includes as follows:
(e) means for deflecting lower energy ones of the secondary electrons, and
(f) means for trapping the lower energy ones of the secondary electrons from the sample to protect the sample from the lower energy electrons.

Alternatively the system includes as follows:
(e) attraction means for attracting electrons located laterally with respect to the sample and below the lateral grid means, the attraction means being positively charged to capture low energy secondary electrons.

Another alternative arrangement includes as follows:
(e) detector means for detecting the charge level during charging of the sample by the charging beam means, the detector having an output,
(f) blanking means for blanking the charging beam means to arrest the charging of the sample in response to an input thereto, the blanking means having an input,
(g) peak detector means for detecting a peak voltage, and
(h) comparator means for actuating the blanking means to blank the charging beam subsequent to detection of a peak voltage, the comparator means having an output connected to the input of the blanking means and the comparator means having inputs connected to the output of the peak detector means and the output of the detector means.

Another alternative embodiment of this invention comprises an electron beam inspection system including
(a) an electron beam directed at a sample having a conductive element thereon,
(b) charging means for electrically charging the conductive element on the sample,
(c) grid means for developing a positive charge for attracting secondary electrons from the sample located
  (1) lateral grid means located laterally with respect to the beam and the sample
  (2) extractor grid means, located above the sample
(d) detector means for detecting the charge level during charging of the sample by the charging beam means, the detector having an output,
(e) blanking means for blanking the charging beam means to arrest the charging of the sample in response to an input thereto, the blanking means having an input,
(f) peak detector means for detecting a peak voltage, and
(g) comparator means for actuating the blanking means to blank the charging beam subsequent to detection of a peak voltage, the comparator means having an output connected to the input of the blanking means and the comparator means having inputs connected to the output of the peak detector means and the output of the detector means.

Still another aspect of this invention comprises a method of testing electrical connections and short circuits of conductors on a body of insulating material without physical contact comprising the steps of:
(a) applying an unfocused flood electron beam with a low current to a broad surface of the body, simultaneously applying a different focused probe electron beam having an energy predetermined to provide a charge of opposite polarity from the flood beam to other areas of the body to be probed,
(b) generating an electron beam to cause secondary electron emission from the conductors; and
(c) detecting the presence of connections not at a given potential,
whereby it is assured that the effects of capacitive coupling are minimized in producing a charge at any given point.

A further aspect of this invention pertains to a method of testing electrical connections and shorts on a body of insulating material, assuming that the totality of networks to be tested is divided into groups in such a way that networks within a group are not strongly coupled to each other said method comprising, A. performing a complete intra group test on said connections in group one to find all opens on networks within group one and all shorts between nets within group one, the intra group test being performed as follows:
  (1) Read the nodes of a network one, whereby a short is detected if a network is found charged in step 1,
  (2) Charge a node of said network,
  (3) Read the nodes of said network one,
  (4) Repeating steps (1)–(3) for for all networks in group one, whereby an open is detected if a node is found uncharged in step (3), and the sequence of steps (1)–(3) for all nets in the group constitutes a complete intra group test,
  (5) discharge the networks in group one,
B. perform a complete intra group test from steps (1) to (5) on group two,
  (6) read the networks in group one where any node found to be at the charge voltage is shorted to a net of group two,
  (7) discharge group two,
C. Perform a complete intra group test on group three,
  (8) read the networks in groups one and two whereby any node found to be at the charge voltage is shorted to a net of group three,
  (9) discharge group three,
D. this pattern in steps B and C is repeated with each group from group one to group N where N is an integer,
  (10) for the last group N perform complete intra group test on group N,
  (11) read the networks in groups 1 to N-1,
whereby test time is minimized by using charge storage on the conductor networks to the maximum extent possible consistent with avoiding false readings due to capacitive coupling.

BRIEF DESCRIPTION OF THE DRAWINGS

FIG. 3 is a plot of a curve of the response of a detector as the potential of a net is increased by the charge beam.

FIG. 4 shows a circuit for using a peak detection circuit to automatically blank the E-beam terminating charging when the desired voltage on a contact on the sample has been reached.

FIG. 5 plots of several curves of voltage as a function of time for several junctions in the circuit of FIG. 4.

DETAILED DESCRIPTION OF THE INVENTION

Apparatus for Large Area Voltage Contrast Detection

Figure 1A:
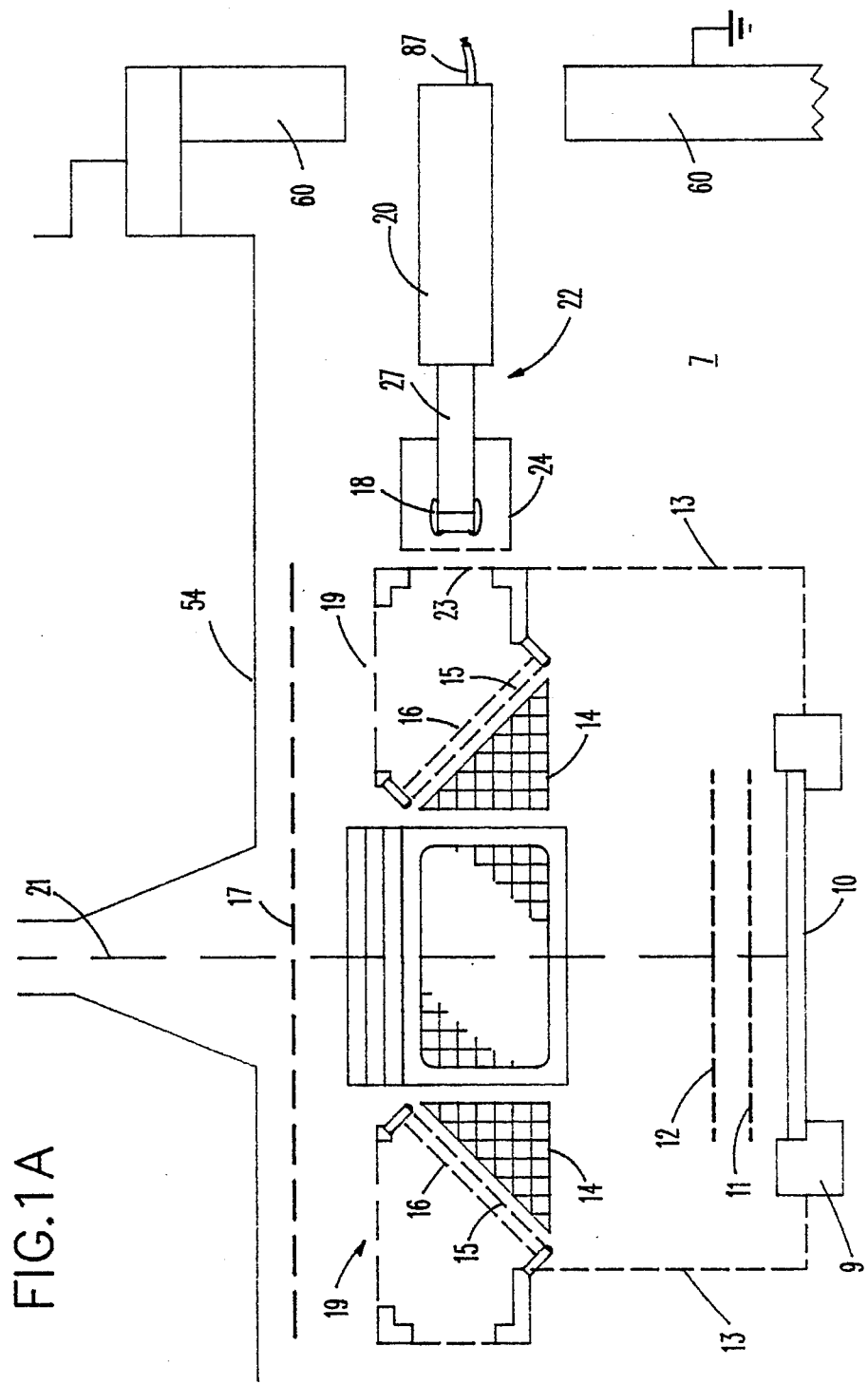
FIG. 1A shows a schematic view of a voltage contrast detector for use in an electron beam testing apparatus in accordance with one aspect of this invention.

FIG. 1A shows a voltage contrast detector adapted for use with an electron beam 21 directed at a sample 10 (device under test) having a plurality of conductive elements thereon. Sample 10 is supported on support 9. Chamber wall 60 is at ground potential.

Figure 1B:
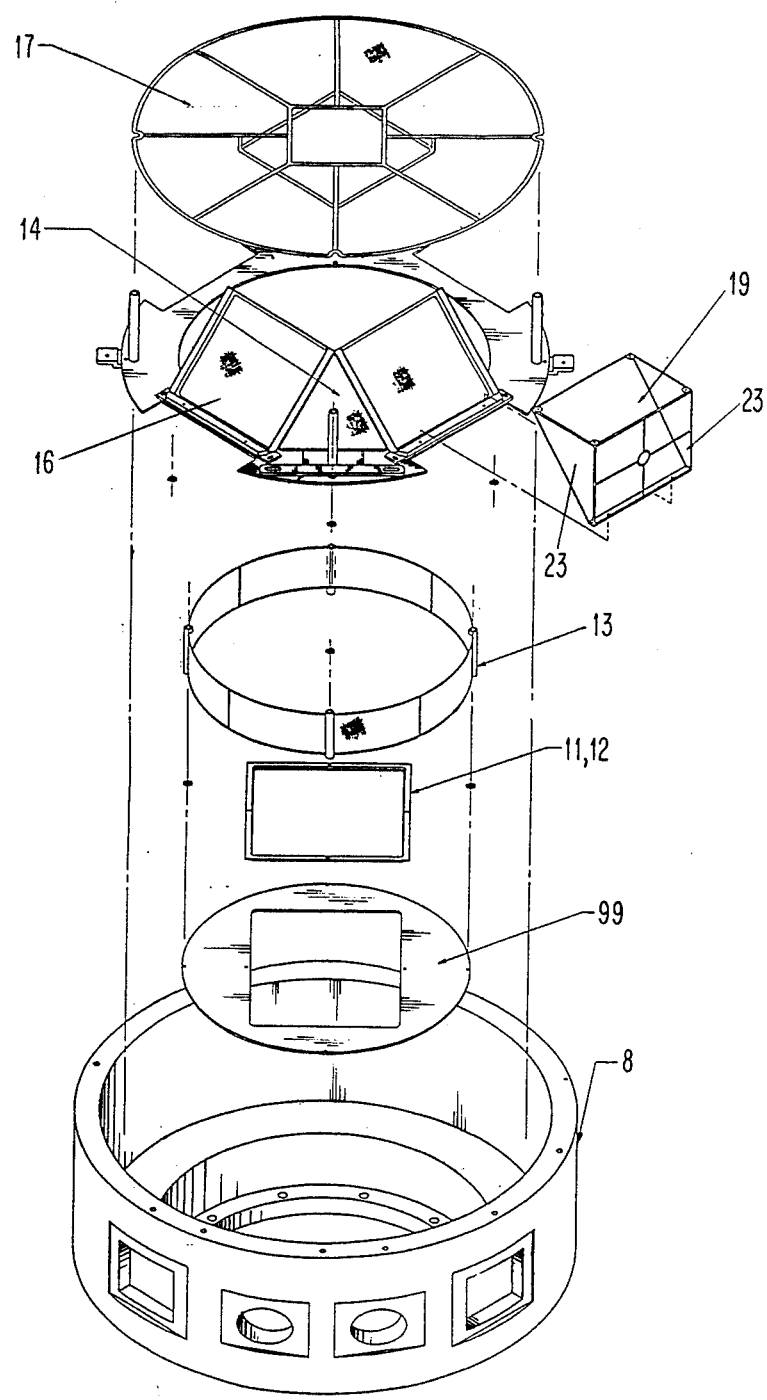
FIG. 1B shows an exploded perspective view of the voltage contrast detector

FIG. 1B shows an exploded perspective view of the system of FIG. 1A. The detector of FIGS. 1A and 1B is adapted for inclusion in the system of FIG. 2 as will be understood by those skilled in the art, but is omitted from that drawing for convenience of illustration. The overall purpose of this apparatus is to collect secondary electrons, efficiently. The electrons collected should belong exclusively to an intermediate range of energy levels. Most low energy electrons, below the intermediate energy level range are repelled by an electrostatic field generated by strategically located portions of the detector.

Most high energy electrons, i.e., backscattered electrons, pass through an open grid structure to leave the detector apparatus and hit the chamber wall and are trapped by a grid structure there.

The beam 21 in FIG. 1A charges conductive elements on the sample 10 (specimen).

Extraction Grids

Above the sample 10 and parallel to the upper surface thereof are stacked a pair of parallel extraction grids 11 and 12, comprising lower extraction grid 11 and an upper extraction grid 12. Grid 11 is biased at a potential positive with respect to sample 10 to accelerate secondary electrons emitted from the sample 10. The relatively high voltage needed on grid 11 would have an undesirable effect of deflecting the primary beam 21 except for the presence of grid 12 which is held at a lower voltage V12. V12 can be chosen so that grid 12 has an acceptably small influence on the primary beam 21 itself while limiting the influence of grid 11 to the space between grid 12 and the sample. Grid 11 is at voltage $V_{11}$ which is about 20 to 50 Volts positive with respect to the sample 10, with the value being chosen as a function of the geometry (in particular the size and spacing between conductors) of the sample, so that secondary electrons are efficiently extracted from the sample.

Rectangular Double Grid Sets

There are means for attracting secondary electrons from the sample 10 comprising lateral grids 15 and 16 located laterally with respect to the beam 21 and the sample 10 and above the sample 10 and grids 11 and 12. Sets of lateral grids 15 and 16 comprise several (four) rectangular double-grid sets of positive and negative grids 15 and 16 respectively arranged "concentrically" about E-beam 21 and about and above the periphery of the four edges of the square E-beam target, i. e. sample 10, which is to be tested by the E-beam 21. The negatively charged top repulsion grid 17 is located above and parallel to the sample 10 with an aperture therethrough for the beam 21. Contrary to appearances, the design of the electrodes (grids) 14, 15, 16 and 17 is not required to approximate the shape of portions of a hemispherical dome. Each positive attraction grid 15 faces the sample 10 and has a slightly positive voltage applied to it. Behind the positive attraction grid 15 in each case is a second grid 16 which can be biased negatively to serve as a retarding grid for repelling low-energy secondary electrons, to prevent them from reaching the secondary electron transducers 22, each of which comprises a sensor 18 for the secondary electrons and a photomultiplier tube 20. Sensor 18 is a scintillation sensor which accelerates secondary electrons and converts energy of the accelerated electrons into photons which are received by photomultiplier tube 20. (Grid 16 can be omitted from the design of the system or grounded. In normal operations it is not required that it be used, but its voltage can be adjusted to optimize performance by tuning the rectangular double grid sets for a specific system.)

Scintillation Sensors

Scintillation sensors 18 lie behind each of the retarding grids 16 and they activate photomultiplier tubes 20 in response to the secondary electrons which are able to pass through an attraction grid 15 and the corresponding one of the retarding grids 16.

Secondary Electron Deflection

It is an important feature of this invention that the rejected low-energy electrons have sufficient lateral momentum, i.e. towards the side of the space above the sample 10, so that they will not fall back onto the sample creating false readings. When the secondary electrons pass through and leave the grid 12 on the way therethrough after starting from the sample 10 and grid 11, the secondary electrons of the predetermined energy level indicative of the condition of the sample 12 are to pass through the four tilted sets of rectangular attraction grids 15 with four retarding grids 16, each of which is parallel to the corresponding attraction grid 15. In addition to the grids 15 and 16 the apparatus of this system includes negatively charged elements for deflecting secondary electrons laterally of the beam 21 and the sample 10. Those means for deflecting secondary electrons include triangular grids 14 between grids 15 and top repulsion grid 17 covering the space about the E-beam above sample 10. Grid 17 extends parallel to the sample 10 with an aperture therethrough for the beam 21.

Triangular Grids

Between adjacent sets of attraction and retarding grids 15 and 16 are positioned the several, (4), triangular repulsion grids 14 which, relatively to grids 15, are quite negative in potential to repel the electrons towards the attraction grids 15. The attraction grids 15 and the triangular repulsion grids 14 along with a negatively charged top grid 17 (which also repels electrons) form an electric field above the sample 10. Grids 14 and 17 create negative, repelling electric field patterns which when combined with the positive charges of attraction grids 15 tend to deflect intermediate energy electrons towards the attraction grids 15, while redirecting the low energy electrons downwardly back towards the sample 10. Actual return of these electrons to the sample 10 is prevented by lateral outward forces exerted by the attraction of the electrons by the positive bias on the cylindrical grid 13 located on the periphery of the space defined by the grids 13, 14, 15 and 17 and the sample 10.

Cylindrical Attraction Grid

Below the back ends of the rectangular grids 15 and the triangular grids 14 is located the cylindrical attraction grid 13 with a positive potential for collection of all of the lower energy secondary electrons which fall back from the space near the attraction grids 15, above. The cylindrical grid 13 is coaxial with the E-beam 21.

The exact number of triangular grids 14 and rectangular grids 15 is not critical, and in fact ideally, the larger the number of each, the better from the point of view of signal uniformity, but the higher voltage on the triangular grids 14 is important in that it causes a peak in the voltage response versus time response curve, as contrasted with the flat and lower voltage curve produced with a previous design, without the numerous additional, negatively charged grids which distort the field to channel the intermediate energy level secondary electrons away from the periphery and towards the scintillation counters 18.

Grids 19 and 23 are biased to direct the intermediate energy electrons to the counters 18 of corresponding secondary electron transducers 22 while allowing the backscattered electrons to pass through to the grid walls of the chamber defined by the grids 16, 19 and 23. Grids 19 and 23 are electrically isolated from each other, and are individually adjusted in bias to optimize the detector voltage response curve as shown in FIG. 5.

Having a sharp response curve is important in that it improves the contrast between charged and uncharged networks. The technique employed involves selection of only those secondary electrons within a narrow range of energy levels, since those which are too high in energy or too low in energy do not have the correct range of kinetic energy to pass through rectangular grids 15 to be sensed by the scintillator 18.

FIG. 1B shows an exploded perspective view of the overall detector structure. The base 8 supports the grid frame base 99 which carries the frame carrying extraction grids 11 and 12. The cylindrical attraction grid 13 is supported on base 8. Second grids 16 are seen between triangular grids 14. Positive attraction grids 15 lie behind grids 16, and so they are not shown in FIG. 1B. Grids 19 and 23 are shown to the right of one of the second grids 16. Top repulsion grid 17 with the hole for the E-beam is shown on top of the overall structure.

It should be understood that the specific configuration of grids 13, 14, 15, 16, 17 and 19 is indicative of an implementation of the concept of selection of secondary electrons with an intermediate or predetermined range of kinetic energies as they leave the sample 10. Behind this implementation is the concept of repelling those electrons of low energy level downwardly and then attracting them outwardly causing them to be deflected to the side of the sample 10. Similarly high energy level secondary electrons are caused to pass to grounded surfaces well above the sample 10. Those with an acceptable, intermediate energy level are repelled to the side and attracted through the grids 15 and 16 to the sensors 18. While for practical reasons the grids 15 and 16 are shown as being rectangular, it is obvious that they can have many other shapes which conform to the requirements of collecting secondary electrons of intermediate energy by grids 15 and 16 and deflecting them by grids 14 and 17. Grid 13 may likewise be of different shapes than cylindrical so long as it provides a lateral grid which attracts and collects the secondary electrons returning towards the sample 10 because they have lower energy

E-Beam Detection System

Figure 2:
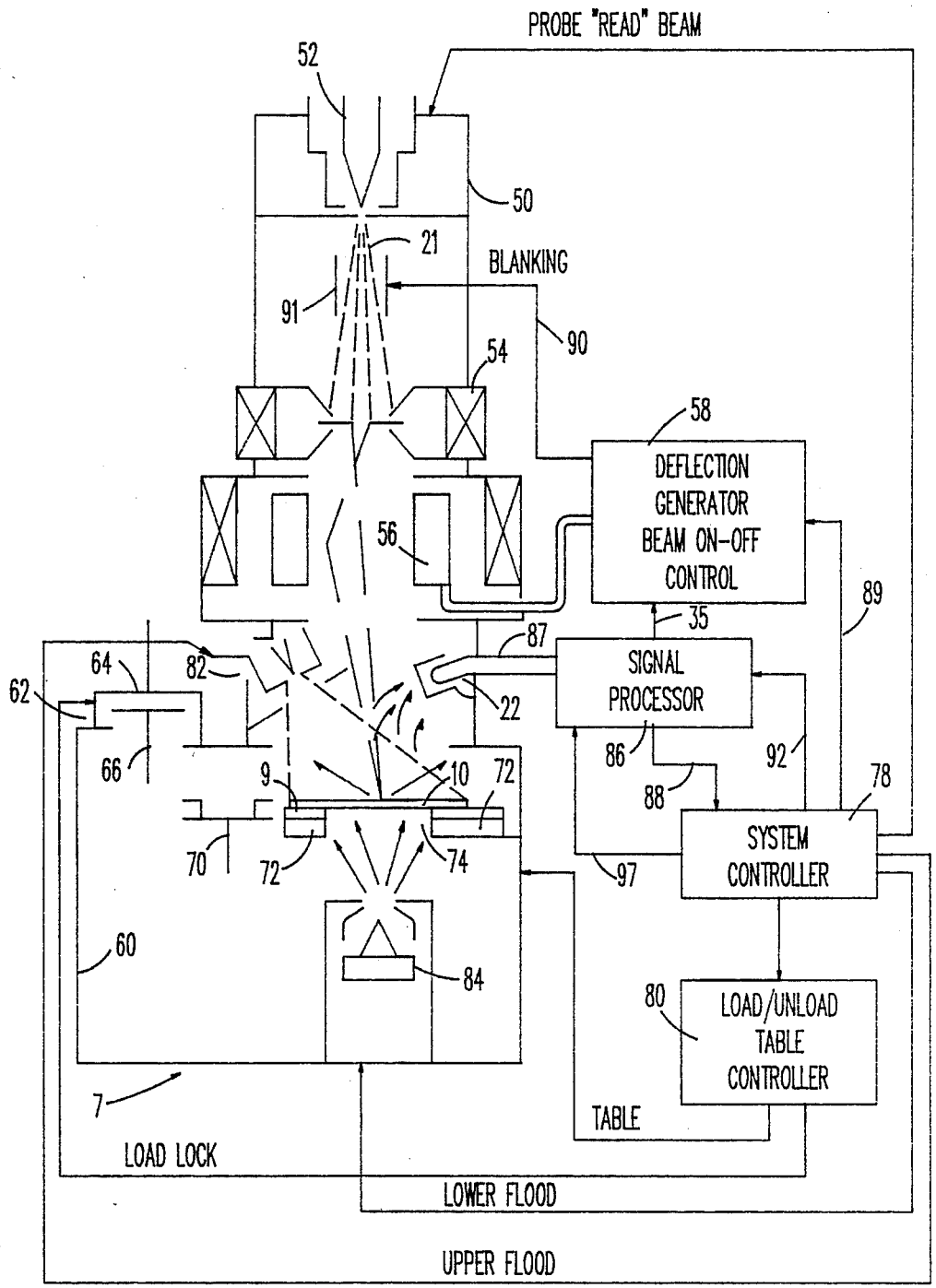
FIG. 2 shows an overall system suitable for inclusion of the apparatus of FIGS. 1A and 1B.

FIG. 2 shows the architecture of an overall E-beam detection system into which the apparatus of FIGS. 1A and 1B fits. The apparatus is simplified for convenience of illustration and clarity of explanation of the underlying details. The assembly of the elements will be well understood by those skilled in the art. An electron beam vacuum column 50 has an electron beam probe gun 52 disposed at one end thereof. A focusing lens system 54 comprising annular coils is used to focus the beam 21 emanating from gun 52. Deflection coils 56, driven by a Deflection-Generator-and-Beam On-off-Control 58, are used for beam steering. The electron optics are similar to those of a scanning electron microscope, well known in the technology.

A processing vacuum chamber 7 with chamber walls 60 has a load lock 62 with a lock port 64 for automatic handling of samples 10 for testing. A loading mechanism 66 is used to receive samples 10 that are mounted on carriers at load lock 62 and to move them to transfer table 70. By means of mechanical pushers, air techniques and the like, samples 10 on supports 9 are moved from transfer table 70 onto the specimen table 72. The table 72 is selectively movable in the X-Y directions in a plane perpendicular to the axis of beam 21 to position predetermined portions of the sample 10 within the beam deflection field, one after the other, seriatim. The table 72 has a port 74 large enough to expose the bottom side of the samples 10. After testing is finished, the samples 10 are transferred in the reverse sequence back to the load lock 62 so that when the lock port 64 is raised, those samples previously tested are removed from the chamber 7 and new specimens to be tested are loaded into the chamber 7. Loading, unloading and the movement of table 72 are controlled by an electronic system controller 78 which provides instructions to the specimen handling (load/unload table) controller 80. Electronic control of transfer movement and port access (in a manner coordinated with overall test procedure) is well known in this art. Such techniques are also well known in semiconductor lithography. The specific features of system controller 78 and controller 80 are well within the state of the art.

The system of FIG. 2 includes two electron flood guns—an upper flood gun 82 and a lower flood gun 84. Guns 82 and 84 are selectively actuated to charge the respective top and bottom surfaces of the samples 10 during various test procedures.

Disposed within column 50 is the secondary electron transducer 22 shown in FIG. 1A. Secondary electron emission results from scanning by the probe or "read" beam 21 generated by gun 52 and is detected by transducers 22, thereby providing on lines 87 an output signal to an input of signal processor 86, which is shown in detail in FIG. 4. The resulting output signal from processor 86, converted to digital form is provided on line 88 to the system controller 78 for purposes of defect detection, and can be displayed and/or stored on a real time monitor (not shown.) In addition, signal processor 86 measures the signal and compares it against a predetermined value and provides blanking signals on line 35 to control unit 58, as described below with reference to FIG. 4.

In operation, input data is supplied to the system controller 78 providing the addresses of the points to be tested on the samples 10, and the output signals expected if electrical continuity is present at each point to be tested. Controller 78 provides signals on line 89 to the Deflection-Generator-and-Beam-On-Off Control 58 in order to provide additional signals pertaining to the control of the exposure (on-off) via line 90 to the blanking control electrode 91. Blanking will be discussed further in connection with the description of the circuit of FIG. 4.

The controller 78 also selects which of the flood guns 82 or 84 will be actuated and in the proper sequence with the E-beam 21, as is well known in the E-beam lithography art. Line 97 from controller 78 adjusts the gain control input of amplifiers 29 in signal processor 86. Line 92 provides an input from controller 78 to adjustable hysteresis circuit 32 to adjust the control of the potentiometer in adjustable hysteresis circuit 32 in processor 86 as shown in FIG. 4. Line 88 connects the output of a digitizer 93 in processor 86 to controller 78, as shown in FIG. 4.

Line 35 connects the beam blanking output from signal processor 86 to control 58 which operates the beam blanking line 90 as explained above. Control 58 also controls the deflection of the probe beam 21 by adjusting the current in deflection coils 56.

Either flood gun 82 or 84 is activated to charge one surface of the specimen and it may or may not be turned off, depending upon the test to be performed. The lower flood gun 84 is employed to test networks having conductors extending from the top surface to the bottom surface of a sample 10. In this mode the probe or read beam 21 is then scanned across the conductor portions on the top surface of sample 10 in a vector or raster mode to the addresses supplied by the controller 78. The read beam 21 causes the generation of secondary electrons from the surface of the sample 10 and the emitted secondary electrons are sensed by the transducer 22.

Referring to FIG. 4, the output of the transducers 22 (upper left) passes through cable 87 to signal processor 86 where it is amplified, digitized and compared to a standard to produce digital and beam blanking output on lines 88 and 35, respectively. This is discussed in greater detail below.

Other details of the system may be further understood by reference to commonly assigned U.S. Pat. No. 4,417,203, the entirety of which is incorporated herein by reference.

Method and Device for Control of the Charging of Conductors by an Electron Beam

The technique of contactless electrical testing of substrates (as described in above-referenced, commonly assigned, U.S. Pat. Nos. 4,415,851 and 4,417,203) relies on the generation of voltages on conducting networks by a focused electron beam of appropriate energy. Subsequently these voltages are read with another electron beam and a suitable voltage contrast secondary electron detector to allow the detection of shorts and opens in the substrate networks.

For the proper functioning of the tester, the charging process must be controlled so that all networks can be reliably and reproductively charged to a specified voltage. This is because undercharging reduces the contrast between charged and uncharged nets and may prevent their proper discrimination. Overcharging is an even more serious problem because there is the possibility of charging to several hundred volts or more when the charging beam current and voltage are chosen to charge networks quickly (millisecs.) as required for an automated high speed tester. Overcharging may create fields large enough to deflect the charging beam, thereby creating addressing errors. Even worse is the effect of such fields on the low energy secondary electrons essential to voltage contrast. Because of this, even a moderately overcharged net may interfere with the reading of neighboring nets. The difficulty of the charging control problem is compounded by the fact that for a high throughput tool it is imperative that an entire substrate of 100 mm × 100 mm is addressable by the electron beam without any substrate movement. It is very difficult to design a voltage contrast detector with perfectly uniform response over such a large area so the charging control method must be effective in spite of detector non-uniformities.

The control method consists of a particular signal analysis method used in conjunction with the voltage contrast detector of FIG. 1A. This detector has the following characteristics:

1. The detector response as a function of the voltage of the test point is strongly peaked at a particular voltage which can be chosen by the adjustment of the potential on various grids in the detector.
2. The voltage corresponding to the peak is constant ±1 volt over a sample.

As the potential of a net is increased by the charge beam the response of the detector traces a curve as illustrated in FIG. 3.

The signal processor circuit 86 shown in FIG. 4 is responsive to transducer 22 consisting of scintillation sensors 18 coupled by light guide 27 to photomultiplier tubes 20. Tubes 20 connect by cable 87 to adding operational amplifiers 29. Circuit 86 causes control 58 to automatically blank the E-beam 21 by means of line 35 to control 58 to line 90 and electrode 91 (terminating the charging of sample 10 by beam 21 when output E rises on line 35.)

Secondary electron transducers 22 include sensors 18 and photomultiplier tubes 20. Sensors 18 generate light transmitted to photomultiplier tubes 20 as illustrated in FIG. 1A.

FIG. 4 shows details of the signal processor 86 in FIG. 2. The outputs of the photomultiplier tubes 20 are connected by cable 87 to a set of adding operational amplifiers 29 within processor 86 in the usual fashion. The outputs of amplifiers 29 are connected by cable A to filter circuit 30 which provides a filtered version on line B of the input from line A. When the combined detected signals on cable 87 fall below a peak value by some adjustable amount denoted by $\Delta V$ in FIG. 5, which represents the fall below the peak voltage on output C in FIG. 4, the beam 21 is blanked by the signal on line 35. The output of filter 30 is connected via cable B to the inputs of peak detector 31 and to the negative input of comparator 33. The output of peak detector 31 is connected via line C to a first input of adjustable hysteresis circuit 32 (including a voltage divider and a potentiometer). Hysteresis circuit 32 has an output D connected to the positive input of comparator 33. As stated above, the negative input of the comparator is connected to line B from filter 30. Comparator 33 is connected to provide a more positive voltage E in FIG. 5 to blank electron beam 21 at time $T_c$, after sufficient charging has occurred as shown in the upper curve in FIG. 5. Referring to FIG. 5 which shows voltages of signals A through E as a function of time, in more detail, input signals A (which are shown as a composite) pass via line A through filter 30 which produces signal B that is supplied to peak detector 31, comparator 33 and digitizer 93. The output signal C of the peak detector 31 is attenuated by the adjustable hysteresis circuit 32 and an output D therefrom is compared against the original input signal B from filter 30 by comparator 33. When the input signal B falls below the modified peak value, at time $T_c$ in FIG. 5, the comparator 33 will sense that the output B is nearer to the value of the output D, so comparator 33 switches its state to yield an output signal E of positive value as shown in FIG. 5. The positive value of output signal E, in turn, produces an output on line 35 to control 58, which in response blanks the beam 21. Feedback of a portion of the comparator's output E to the other input E on the right end of adjustable hysteresis circuit 32 insures latch up of the output of comparator 33 despite noise on the input signals A.

This charging control method has been implemented successfully. The result is that automatically controlled charging curves are obtained during testing of a sample for different settings of $\Delta V$.

This charging control method has some important advantages over any alternative method we have considered.

1. All networks are charged to the same voltage despite unavoidable variation in absolute signal level caused for example by surface topography, contamination, or detector non-uniformity.
2. Each net is left at the voltage which produces a maximum signal when the net is subsequently read.
3. If charging is attempted on an already charged net, the feedback signal immediately decreases and the beam is blanked within several microseconds, providing protection against overcharging.
4. Simple hardware implementation suited for high throughput applications.

Methods for Testing of Capacitively Coupled Networks

This method of testing uses an electron beam of appropriate energy to charge the nodes of conductor networks which are subsequently read by a second beam in combination with a voltage contrast secondary electron (S.E.) detector to detect opens (open circuits) and shorts (short circuits).

As described in U.S. Pat. No. 4,417,203 of Pfeiffer et al. (cited above), the test sequence consists of charging a node of a net, reading all other nodes to verify continuity; then proceeding to the next net. Shorts are detected when a net is read before charging and found to be charged.

The possibility of a relatively high throughput for complex substrates depends to a large extent on the efficiency inherent in this test method. Exploiting charge storage on the substrate means that the total test time increases proportionally to N, the total number of test points, rather than $N^2$ as would be the case for mechanical probing where each point is tested against all others.

Problem Solved by Method

Figure 6:
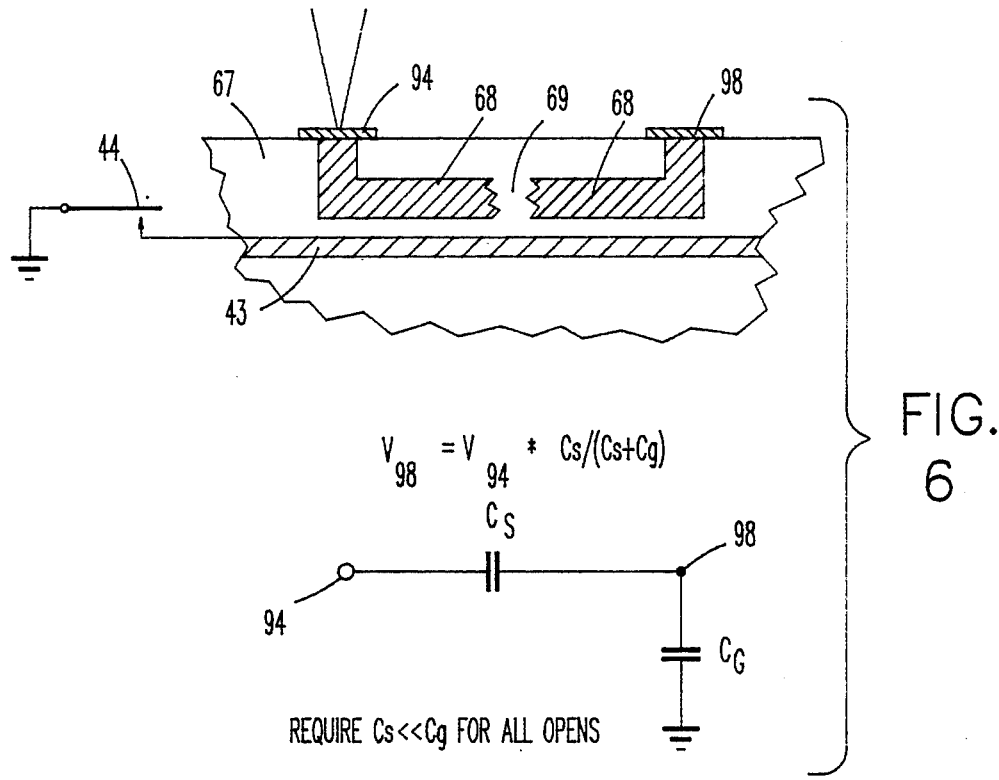
FIG. 6, is a schematic diagram of a network with an open between nodes A and B with an E-beam applied to node A.
Figure 7:
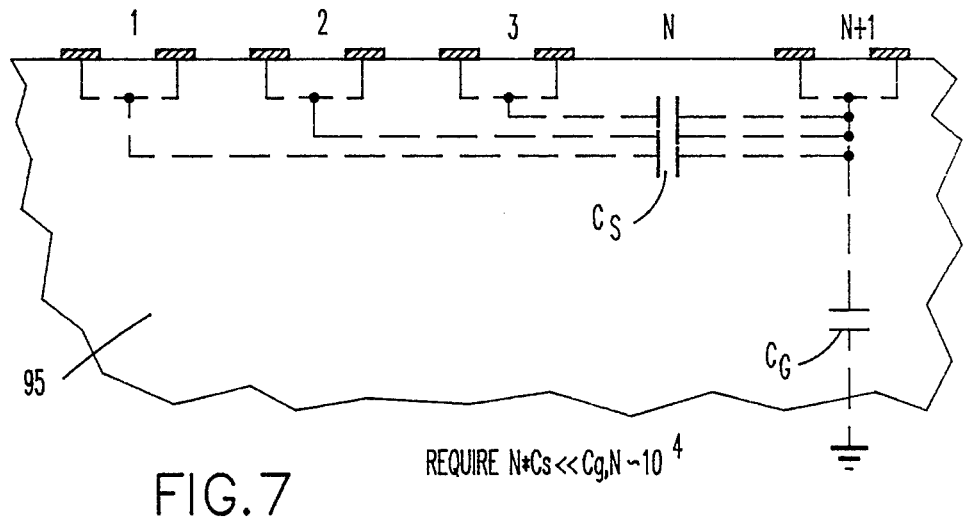
FIG. 7 is a schematic diagram of N nets capacitively coupled to the N+1th net with a nominal series capacitance $C_s$ and the N+1th net being coupled to ground through capacitance Cg.

The test method as described in U.S. Pat. No. 4,417,203 (cited above) left a problem caused by electrostatic coupling of networks in the substrate, which is illustrated by FIGS. 6 and 7. The charging of one network on a substrate with an E-beam to a given potential can and does influence the potential of other adjacent networks. In actual substrates, this coupling is frequently so strong as to make networks appear to be shorted together, when in fact they are not. Alternatively, such coupling can be so strong as to prevent the detection of opens in networks.

In other words, without a solution to the problems presented by capacitive coupling, electron beam continuity testing has limitations under such circumstances.

The testing methods in accordance with this invention, which are described below, allow opens/shorts testing of capacitively coupled networks using electron beams. This electron beam testing method actually detects opens and shorts only indirectly by measuring voltages which in turn are determined by the ratios of certain capacitances in the substrate.

Referring to FIG. 6, consider a substrate 67 of an insulating material such as a ceramic with a line 68 buried within the substrate 67. The line 68 is part of a network between nodes 94 and 98 with an open (break) 69 between nodes 94 and 98. If node 94 is charged to a voltage $V_{94}$, potential at point 98 depends on the capacitance in-series $C_s$ and the capacitance-to-ground $C_g$, as shown by the equation which follows:

$$V_{94} = \frac{C_s}{C_s + C_g} V_{98}$$

where:
 $C_s$ is capacitance-in-series, and
 $C_g$ is capacitance-to-ground
For the open 69 to be reliably detected, we will need as follows:
 $V_{94}$ much less than $V_{98}$, or
 $C_s$ much less than $C_g$ for all opens.

For complex substrates with a larger number of networks it is desirable from the point of view of reduced test time to employ a test method which exploits charge storage on the substrate.

Initially all networks on the substrate are brought to a uniform potential which can be chosen for convenience to be nominally 0 volts. As is well known in this art, this can be accomplished in a number of ways, e.g., by scanning the substrate with an electron beam whose energy has been chosen to charge the conductors and substrate positively. The positive charging is a self-limiting process which can be controlled by the voltage applied to a grid above and parallel to the substrate.

Continuity within networks is verified by charging a node of a network to a certain potential, then reading the other nodes to verify that they are at the same potential. Shorts between networks are detected by reading the first node of each network before performing the charging/read sequence described above.

If a node is found to be at the charge potential prior to charging by the beam, it must be shorted to a previously charged network. As the test proceeds more and more networks are charged to the charge potential.

The electrostatic fields of each of these nets affects the potential of the uncharged nets remaining to be tested to an extent which depends on the direct capacitive coupling between the nets. The increase in potential caused by capacitive coupling is indistinguishable from that caused by actual injection of charge by the electron beam.

Referring to FIG. 7 nets from 1 to N+1 on insulating substrate 95 are illustrated with N equal to about 10,000 as would be typical for a large multi-chip module.

Assume nets 1 through N have been tested and left charged to a voltage V1 and consider the initial reading of the net N+1. If this net is really isolated for all N previously tested nets, its potential, $V_{N+1}$, must again be much less than $V_1$ $$[\text{but } VN + i = \frac{NCS}{NCS + Cg} V1$$

where we assume that each of the nets $1-N$ is coupled to net N+1 by a series capacitance CS. We therefore require]

N * ($C_S$ typ) much less than $C_g$, for N of the order of 10,000.

This is a stringent requirement which is not always met by all types of substrates.

This aspect of this invention consists of techniques to successfully test a wide variety of substrate types. The technique used depends on the ratio $Cs/C_g$ for the particular kind of substrate. We will first describe the method for the situation of $Cs/C_g$ of order 1, i.e., a high degree of coupling between typical networks and a relatively small capacitance to ground.

Test Method for Packages with Strongly Coupled Networks; CS/CG of Order 1

Figure 8:
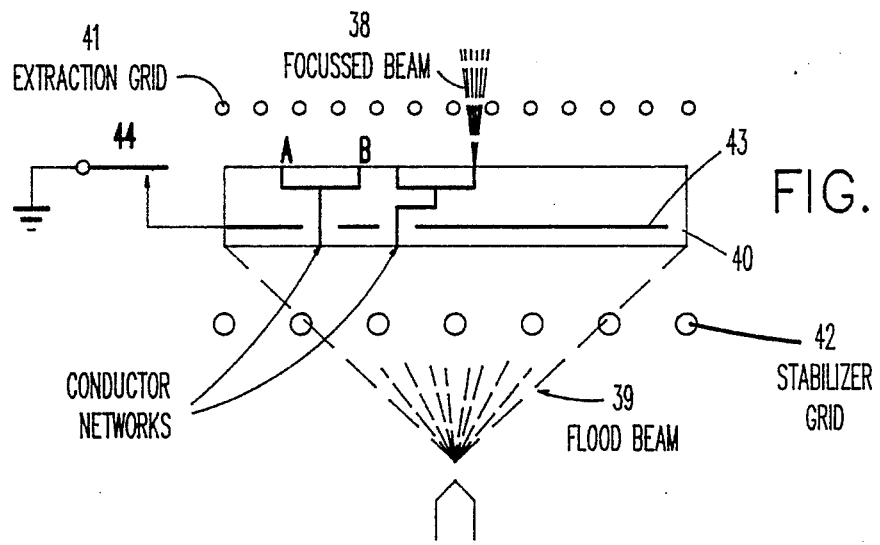
FIG. 8 is a schematic illustration of a package structure suitable for employing a testing method in accordance with another aspect of this invention, employing a focussed probe beam from above a sample and an unfocused flood beam from below.

In FIG. 8 all nets are first charged by the flood beam. A net is individually discharged using the focussed beam. Continuity within the net is verified by reading the other net nodes to check that they are all discharged. The next net is then read. A low reading indicates a short to a previously discharged net. The net is then discharged and the test continues in this way.

A substrate package structure composed of substrate 40 with conductor nodes A and B of corresponding networks within the substrate 40 is illustrated schematically in FIG. 8. The test method employs a focussed probe beam 38 from above substrate 40 and an unfocused flood beam 39 from below substrate 40. The energy of probe beam 38 is chosen so that it will charge a node A or B positively to a voltage determined by the potential on the top surface, extraction grid 41. The beam current of beam 38 is chosen so that the positive equilibrium potential is reached in a few tens of milliseconds. The potential of a node (e. g.: A or B) can be read by this beam without significant charging by using short pulses of a microsecond or so. The original Golliday, et al test method consisted of first negatively charging all nodes to a voltage $V_1$ determined by the potential of lower stabilizer grid 42 which lies below the substrate 40 (S.D. Golladay, H.C. Pfeiffer, and M.A. Sturans, "Stabilizer Grid for Contrast Enhancement in Contactless Testing of MLC Modules", IBM Technical Disclosure Bulletin Vol 25, No. 12, May 1983, pp. 6621–6623). Subsequently, the flood gun 39 is turned off. The first net, B, then is discharged by the focussed beam 38. Continuity within the net B is verified by reading the other net nodes to check that they are all discharged. The next net A is then read. A low reading indicates a short to a previously discharged net. The net A is then discharged and the test continues in this way.

However, the method just described is vulnerable to capacitive coupling between networks. This coupling is illustrated by the scope traces in FIGS. 9 and 10 for a particular kind of substrate. The traces show the voltage contrast signal when the electron beam addresses nodes on the packaging sample. The height of the pulses is roughly proportional to the voltage on the net (more negative nodes produce larger pulses).

Figure 9:
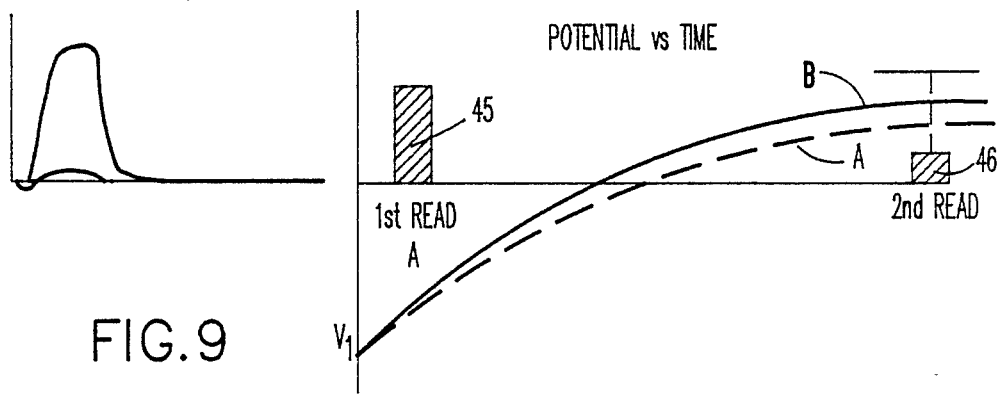
FIGS. 9 and 10 show scope traces illustrating capacitive coupling between networks.

As shown in FIG. 9 for an experiment EXP. 1, in accordance with this invention, the higher pulse 45 corresponds to the voltage to which net A in FIG. 8 has been charged by the flood gun 39. After a capacitively coupled adjacent net B was discharged, net A was re-read (in the second of two successive readings shown in FIG. 9 on the far right), producing the smaller pulse 46. The potentials on the two nets during the experiment are shown in FIG. 9. In this case one would erroneously conclude that nets A and B are shorted together, whereas the fact is that the similar potentials are caused exclusively by capacitive coupling $C_s$, in this example.

Figure 10:
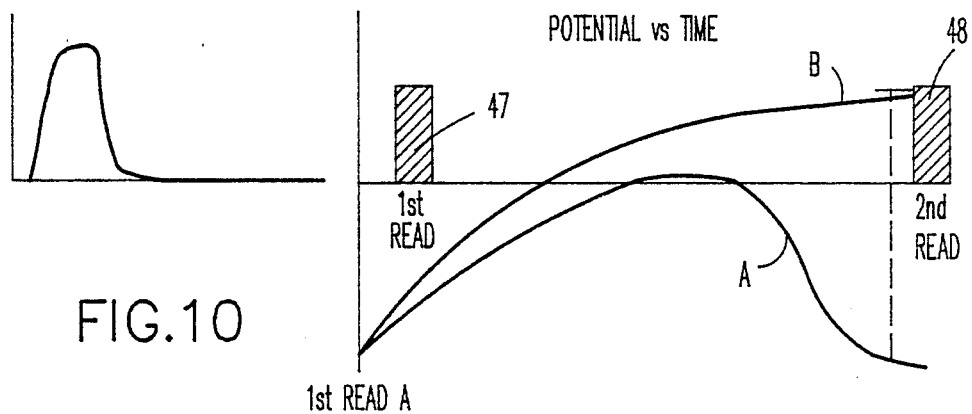

The key idea for network decoupling is the simultaneous application of one electron beam to the circuit under test and another to other circuits capacitively coupled to the first. With properly chosen beam parameters, the coupled circuits can be driven to different voltages unless they are in fact shorted together, thereby allowing continuity testing. This general idea can be applied in different ways depending on the particular substrate. For the chip package of FIG. 8, decoupling can be accomplished by adopting a different test method which includes flood gun irradiation from gun 39 of all networks while simultaneously probing individual net A or net B with the focussed beam 38. If one chooses a low enough current from flood gun 39, the net A will still be driven positive by simultaneous application of both the probe beam 38 and the flood beam 39, within some time t1. If the time required to charge all the nets on a part with this value of flood gun current is t2, then applying both beams for time t3 where t3 max (t1, t2) will charge one net positively while charging the rest to a negative voltage. FIG. 10 shows the decoupling achieved in this way. As in Exp. 1, net A is read before and after net B was discharged, except that the flood gun was on during the discharge of net B. Now the two successive readings 47 and 48 of net A are indistinguishable; net A has been decoupled from net B. The difference between the two voltage curves A and B is proportional to elapsed time.

For the particular package of Exp. 1 the decoupling can be accomplished by flood gun irradiation of the bottom surface because all networks in this substrate have connections to the bottom surface. Alternatively, as will be obvious to those skilled in the art the instant method can also be implemented using top surface flood guns as well.

In the FIG. 9 method, the steps are as follows:
READ A
DISCHARGE B
READ A

In the FIG. 10 method, the steps are as follows:
READ A
DISCHARGE B
(FLOOD GUN ON)
READ A The new test method of FIG. 10 discharges each net as described above and then reads all other nets to test for shorts to the discharged net, (allowing for non-duplication). The test time is therefore proportional to $N^2$ where N is the number of nets to be tested. For the relatively few networks in this type of package (about 200) this is still a viable method and has been used successfully.

Large packages have too many nets for this to be practical so a different test method is used and the way.

Test Method for Packages with Weakly Coupled CS/CG approximates 1/10,000

In larger packages there are 100 to 500 times more networks than in the smaller packages discussed above. As the testing time with the new testing method described above grows as $N^2$ this approach may be impractical for packages with reasonable throughput. Therefore, we require a test method which exploits charge storage on the package substrate to reduce test time. In that case this invention provides methods by which this can be accomplished.

The problem is to insure that the capacitance ratio requirements of FIG. 6 are met. Fortunately, referring to FIGS. 6 and 8. some package designs provide a way to accomplish this; for example, where substrates include heavily metalized planes 43 (with the same numerals in both FIGS. 6 and 8 for the power planes 43 and switch 44) which in the completed functional module are connected to the various power supply voltages. All nets are strongly coupled to such power planes 43. If one or more power planes 43 (in substrate 67 or 40 respectively) is held at any convenient voltage, e.g. ground by closing switch 44, the effect is to increase $C_g$ of FIG. 6 enormously. There is an additional benefit in that the power planes 43 act as partial electrostatic shields between the other nets so the capacitances $C_s$ are reduced at the same time.

The control over the voltage of power plane 43 can be accomplished most easily by making physical contact to one of the large output pads on the bottom of the package (as will be well understood by those skilled in the art.) If a contactless test method is desired, the potential of a power plane 43 can be controlled by a flood gun/stabilizer grid on the bottom of the package. As this would charge all other thru connections, shorts between thru connections would have to be found in a separate test. As there are relatively few networks of this type a modification of the substrate test procedure described above for the strongly coupled packages could be used for this limited subset of the total test.

An alternative contactless method employs a focused beam and a suitably shaped stabilizer grid so that a node of the power plane is irradiated and potential is controlled focused beam. The test method in this case is exactly the same as in the case where physical contact is made to the power plane.

General Case:

Thus far we have described the test method for two (2) types of substrates, with vast differences in their suitability for electron beam testing using a charge storage method. For the substrate with strongly coupled nets Cs/Cg is about equal to one and charge storage cannot be exploited to reduce test time. For a large package with an internal power plane which is grounded Cs/Cg may be or order 1/10000 and it may be possible to take full advantage of charge storage. This would mean, for example that for a substrate with 10000 nets the last net would be tested with the 9999 proceeding nets all charged.

In general, one might expect to encounter intermediate cases ($C_s / C_g$ about equal to from 10 to 1/1,000) in a product, and next we describe the test method applicable in this situation.

The Segmented Test Method

For any given part and ordering of the nets to be tested, one could determine by experiment how many nets could be tested sequentially with the charge storage method before false shorts begin to be detected; call this number $N_s$. One could then segment the test to use charge storage as much as possible by testing in the following way. Assume the nets to be tested are in order on a list. One tests the first $N_s$ nets by charging/discharging the first net, reading its nodes for opens, and proceeding to the next net. Shorts are detected by reading a net before charging it, then reading its nodes for opens, etc., in short using charge storage for an "intra group" test. When all nets 1 to $N_s$ are "intra group" tested this way one would discharge all nets and begin the test again on the next group of N nets, starting at net $N_s+1$. The new feature is that when all of the second group of nets is "intra" tested, one would reread the group $1-N_s$ to find "inter group" shorts. One then discharges, performs intra group testing on the third group of nets, followed by reading the first two groups. This procedure is then repeated for the entire part.

The particular method of intra group testing by reading preceding groups could be modified, for example, to reading following groups instead, but this makes no essential difference to the method. The number of test operations (reading/charging) is now roughly proportional to $N^2/N_s$.

For achieving the minimum test time, $N_s$ should be as large as possible and this can be influenced by how the net list is ordered, i.e. by constructing groups of nets which are not strongly coupled because of distance from each other, or shielding effects.

The Segmented Test Method is a method of testing electrical connections and shorts on a body of insulating material whereby test time is minimized by using charge storage on the conductor networks to the maximum extent possible consistent with avoiding false readings due to capacitive coupling.

Assume that the totality of networks to be tested is divided into groups in such a way that networks within a group are not strongly coupled to each other. The steps to be performed are as follows:

I. Perform a complete intra group test on group 1.

An intra group test finds all opens on networks within a group and all shorts between nets within a group.

An intra group test is performed as follows:
A. Read the nodes of a network 1
B. Charge a node of the network 1.
C. Read the nodes of the network 1.

Repeating steps A–C for network 2 i.e.,
A. Reading the nodes of network 2.
B. Charging a node of network 2.
C. Reading the nodes of network 2.

Repeating steps A–C for all networks in the group. A short is detected if a network is found charged in step A. An open is detected if a node is found uncharged in step C. The sequence of steps A–C for all nets in the group constitutes a complete intra group test.

II. Discharge the networks in group 1.
III. Perform a complete intra group test on group 2.
IV. Read the networks in group 1. Any node found to be at the charge voltage is shorted to a net of group 2.
V. Discharge group 2.
VI. Perform a complete intra group test on group 3.
VII. Read the networks in groups 1 and 2. Any node found to be at the charge voltage is shorted to a net of group 3.
VIII. Discharge group 3.

This pattern is repeated with each group. For example for the last group, group N
IX. Perform complete intra group test on group N
X. Read the networks in groups 1 to N−1.

For minimum test time it is important to minimize the number of groups used to perform the complete test by including as many nets as possible in each group. This is accomplished by grouping nets which are not strongly capacitively coupled because of physical distance or electrostatic shielding. In practice, the limit to the number of nets per group can be determined by increasing the number of nets per group until false errors due to capacitive coupling are detected.

Industrial Applicability

Novel apparatus and methods of continuity testing using electron beams have been described which allow successful testing of large and very large chip packaging type products.

What is claimed is:

1. An electron beam testing system including:
   (a) means for directing an electron beam at a sample having a conductive element thereon,
   (b) charging means for electrically charging said conductive element on said sample,
   (c) grid means for developing a positive charge for accelerating secondary electrons from said sample, said grid means comprising:
       (1) lateral grid means located laterally with respect to said beam and said sample, and
       (2) extractor grid means located above said sample;
   (d) electrostatic deflection means located above said sample comprising elements for developing a negative charge for generating an electric field above said sample adjacent to said lateral grid means for deflecting secondary electrons generated on said sample laterally away from said beam and away from said sample and towards said lateral grid means.

2. A system in accordance with claim 1 including
   (e) means for deflecting lower energy ones of said secondary electrons associated with said lateral grid means, and
   (f) means for trapping said lower energy ones of said secondary electrons from said sample to protect said sample from said lower energy electrons.

3. A system in accordance with claim 1 including
   (e) attraction means for attracting electrons located laterally with respect to said sample and below said lateral grid means, said attraction means being positively charged to capture low energy secondary electrons.

4. A system in accordance with claim 1 including
   (e) detector means for detecting the charge level during charging of said sample by said charging beam means, said detector having an output,
   (f) blanking means for blanking said charging beam means to arrest the charging of said sample in response to an input thereto, said blanking means having an input,
   (g) peak detector means for detecting a peak voltage, and
   (h) comparator means for actuating said blanking means to blank said charging beam subsequent to detection of a peak voltage, said comparator means having an output connected to said input of said blanking means and said comparator means having inputs connected to the output of said peak detector means and the output of said detector means.

5. An electron beam testing system including
   (a) means for directing an electron beam at a sample having a conductive element thereon,
   (b) charging means for electrically charging said conductive element on said sample,
   (c) grid means for developing a positive charge for attracting secondary electrons from said sample including
       (1) lateral grid means located laterally with respect to said beam and said sample,
       (2) extractor grid means located above said sample;
   (d) detector means for detecting the charge level during charging of said sample by said charging beam means, said detector having an output,
   (e) blanking means for blanking said charging beam means to arrest the charging of said sample in response to an input thereto, said blanking means having an input,
   (f) peak detector means for detecting a peak voltage, and
   (g) comparator means for actuating said blanking means to blank said charging beam subsequent to detection of a peak voltage, said comparator means having an output connected to said input of said blanking means and said comparator means having inputs connected to the output of said peak detector means and the output of said detector means.

* * * * *